United States Patent
Shute et al.

(10) Patent No.: US 8,666,325 B2
(45) Date of Patent: Mar. 4, 2014

(54) POLAR FEEDBACK RECEIVER FOR MODULATOR

(75) Inventors: Nick Shute, Munich (DE); Andrei Panioukov, Munich (DE); Zdravko Boos, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 661 days.

(21) Appl. No.: 12/327,687

(22) Filed: Dec. 3, 2008

(65) Prior Publication Data
US 2010/0136937 A1 Jun. 3, 2010

(51) Int. Cl.
*H04B 1/00* (2006.01)
*H04B 15/00* (2006.01)

(52) U.S. Cl.
USPC .............................. 455/69; 455/126; 455/295

(58) Field of Classification Search
USPC ................ 455/126, 295, 522, 127.1, 69, 552
See application file for complete search history.

(56) References Cited

U.S. PATENT DOCUMENTS

| | | | |
|---|---|---|---|
| 6,194,963 B1 * | 2/2001 | Camp et al. | 330/149 |
| 6,650,875 B1 * | 11/2003 | Rozenblit et al. | 455/91 |
| 6,928,272 B2 * | 8/2005 | Doi | 455/114.2 |
| 7,248,643 B2 * | 7/2007 | Takabayashi et al. | 375/296 |
| 7,346,122 B1 | 3/2008 | Cao | |
| 7,558,542 B2 * | 7/2009 | Nandipaku et al. | 455/127.2 |
| 2002/0101938 A1 * | 8/2002 | Horaguchi et al. | 375/297 |
| 2002/0196864 A1 | 12/2002 | Booth | |
| 2006/0160499 A1 * | 7/2006 | Puma | 455/116 |
| 2006/0189285 A1 * | 8/2006 | Takano et al. | 455/127.2 |

* cited by examiner

*Primary Examiner* — Quan Tra
(74) *Attorney, Agent, or Firm* — Eschweiler & Associates, LLC

(57) ABSTRACT

This disclosure relates to linearization in polar modulators of wireless communication devices, to attain linear amplification and high power efficiency during transmission.

13 Claims, 5 Drawing Sheets

POLAR FEEDBACK RECEIVER FOR MODULATOR

BACKGROUND

A modulator, such as a polar modulator, in a wireless communications device may require spectral quality for modulation schemes. Typically, most wireless communications devices are based on constant-envelope modulation schemes (i.e., phase or frequency modulated). An advantage with constant-envelope modulation scheme provides that a final radio frequency (RF) power amplifier in the polar modulator does not have to be linear, and as a consequence, the final RF power amplifier can be operated in the most power efficient region near saturation. However, a drawback with constant-envelope modulation scheme is the inefficient use of the RF spectrum, where data rate transmission for a given bandwidth is not maximized.

To utilize the RF spectrum efficiently, a varying envelope and varying phase modulation scheme may be used. When a varying envelope modulation is applied to a power efficient nonlinear amplifier, distortion may be generated by the nonlinear amplifier which may cause interference with adjacent channels. The distortion may also result in detection error of the information signal at the receiver end of the communication channel. For most applications, the distortion is to be avoided, and may require a linear amplifier; however, linear amplifiers typically have low power efficiency, making a linear amplifier unsuitable for varying envelope and phase modulation scheme. To obtain linear amplification and high power efficiency for transmission in the polar modulator, linearization of a power efficient and nonlinear amplifier may be implemented.

Linearization may refer to a method of compensation or correction of non-linearity in a polar modulator component to maintain stability at the output of the polar modulator. Linearization of the polar modulator may require a feedback receiver component to couple the polar modulator output into a signal path of the amplifier's input. The feedback receiver component may produce linear amplification and power efficiency in the polar modulator.

The feedback receiver component may be used as a quadrature demodulator and require additional circuitry (e.g., high frequency local oscillator, mixers, 90 degree shifters, etc.). Such additional circuitry may draw significant amounts of current in the polar modulator. Furthermore, delay sensitivity may further be included due to different delays in signal sources and local oscillator input used in the quadrature demodulator. The delay sensitivity may result in degradation of the circuitry at microwave frequencies due to sub nanosecond delay variation requirements.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure is directed towards techniques and methods of performing linearization in the polar modulator to attain linear amplification and high power efficiency during transmission. Although a polar modulator is described, it is contemplated that the techniques and methods may be applied to other modulators. The linearization may be implemented through the use of a polar feedback receiver in the polar demodulator to directly extract magnitude and phase baseband signal in modulated radio frequency (RF) output. The polar feedback receiver avoids the use of additional circuitry (e.g., quadrature demodulator) which may include additional current consumption and delay sensitivity in the polar modulator.

Figure 1:
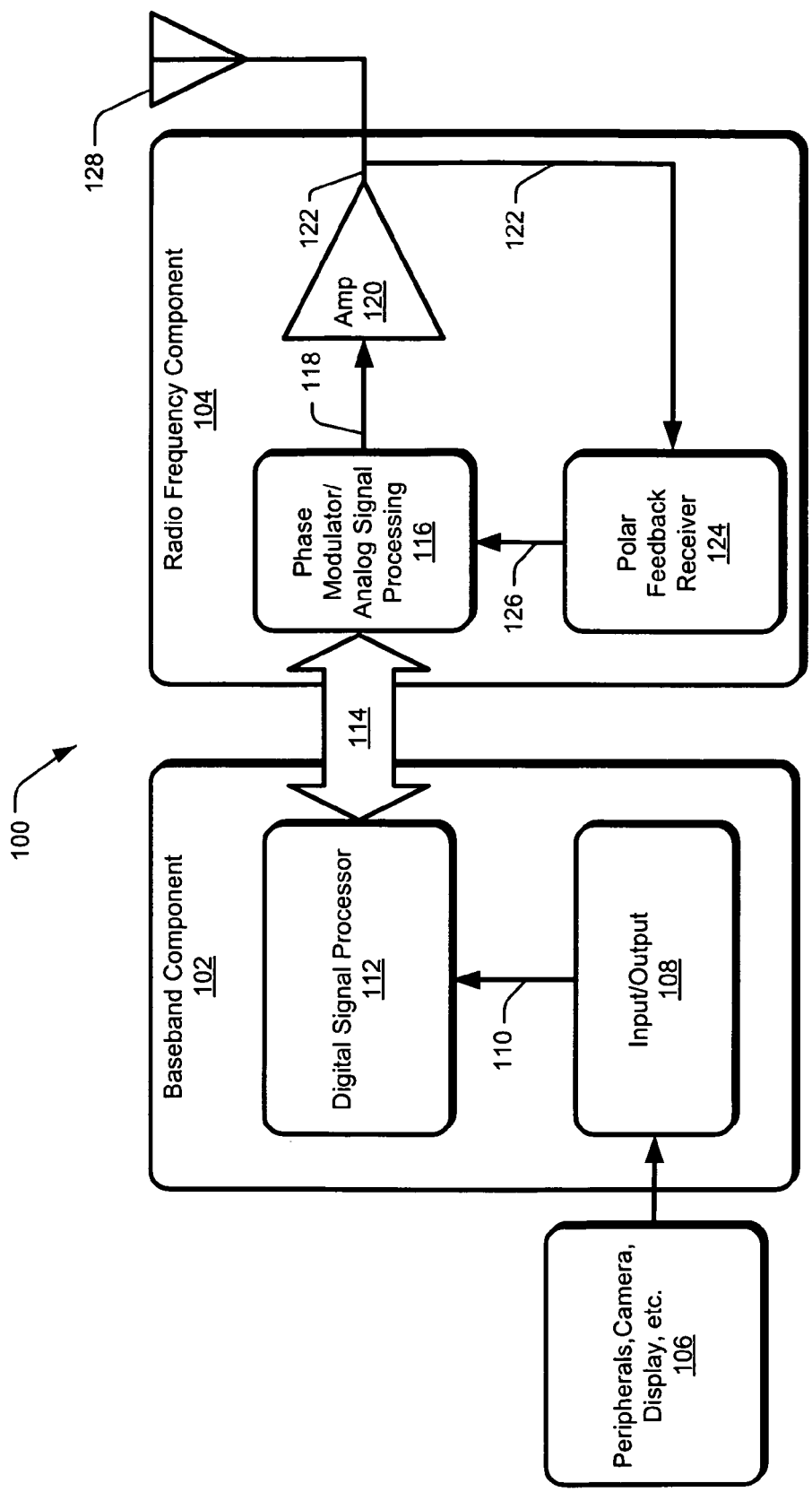
FIG. 1 is a block diagram of a polar modulator component.

FIG. 1 illustrates a polar modulator component 100 that includes a baseband component 102 and a RF component 104. During transmission, baseband component 102 may encode a data signal; identify the data signal's prior state before modulation; convert the inphase signal (I) and quadrature phase signal (Q) into polar form; and transmit the data signal for modulation. Output from the baseband component 102 is referred to as a baseband signal. During demodulation, baseband component 102 may identify the prior state of the data signal following demodulation. The baseband component 102 decodes the demodulated data signal to re-create the data signal. The prior state of the data signal may include attributes of the data signal, such as amplitudes of I and Q, frequency, and phase amount.

During modulation, RF component 104 may combine the baseband signal with RF frequency carrier to produce a modulated RF frequency signal, amplify the modulated RF frequency signal, and further filter the modulated RF frequency signal before transmission. The RF frequency carrier may refer to the frequency of oscillation in the RF component 104 when a modulating baseband signal is not present. During receiving, the RF component 104 may receive the modulated RF frequency signal, amplify the modulated RF frequency signal, filter the modulated RF frequency signal, and demodulate the modulated RF frequency signal.

A signal from peripherals, camera, display etc. 106 may be received by Input/Output (I/O) component 108 for initial processing. The I/O component 108 may convert analog data signals into digital data signals, while the digital data signals are maintained in the same state (i.e., remain digital). Furthermore, the I/O component 108 may process the data signals to produce the amplitudes of I and Q.

The data signals 110 are received by a digital signal processor (DSP) 112. The DSP 112 may use a filter to limit the bandwidth forming a spectrum of the equivalent low pass signal or baseband signal. The DSP 112 may include a Coordinate Rotation DIgital Computer (CORDIC) component to transform the amplitudes of I and Q of the baseband signal into equivalent polar representations. The equivalent polar representations may contain the phase and magnitude of the baseband signal, where the magnitude of the baseband signal may also refer to amplitude of the baseband signal.

After transformation of the baseband signal into the equivalent polar form, the baseband signal from the DSP 112 may pass through digital interface 114. The digital interface 114 may provide concurrent bidirectional communications between the baseband component 102 and RF component 104. The digital interface 114 may contain clock signals to provide timing references for transmit and receive communications between baseband component 102 and RF component 104.

During transmission, the baseband signal from digital interface 114 is received by phase modulator/analog signal processing component 116. The phase modulator/analog signal processing component 116 may include an output that contains the modulated RF signal by varying the phase and magnitude of the RF carrier corresponding to the baseband signal to be transmitted. The phase modulator/analog signal processing component 116 may further support the linearization mechanism for the polar modulator 100. A modulated RF signal 118, which is the output of phase modulator/analog signal processing component 116, is passed to a nonlinear amplifier 120 for further amplification before transmission. The nonlinear amplifier 120 may include a relatively high power efficient amplifier suitable for varying envelope and phase modulation scheme.

A modulated RF signal 122 is an output of the nonlinear amplifier 120. The modulated signal 122 may contain distortions which may cause interference in the adjacent channels. The distortions may be caused by unexpected delay between the phase modulation signal and amplitude modulation signal. The unexpected delay may result in the signals (e.g., phase modulation and amplitude modulation) being applied to different portions of the RF carrier. Furthermore, the amplitude modulation may cause inadvertent phase modulation due to undesired feedback between phase modulation components and amplitude modulation components. The distortions may not only cause interference to the adjacent channels, but may also affect reception at the receiving end. Therefore, the distortions should be avoided in order to produce linear amplification, and for high power efficiency transmission.

In an implementation, linearization may be used to compensate for the distortions at the polar modulator 100. The linearization may include coupling of the polar modulator 100 output (i.e., signal 122) into a polar feedback receiver 124. The polar feedback receiver 124 may be used for polar demodulation of the loop back polar modulator 100 output in order to directly extract the phase and magnitude of the modulated RF signal. A linearization mechanism that includes the polar feedback receiver 124 may be made adaptive by extracting an error signal (e.g., phase and magnitude distortion) coefficient at the output (i.e., signal 122) of the polar modulator 100. The error signal coefficient may include unexpected delay between the phase modulation signal and amplitude modulation signal which may result in distortions in the polar modulator 100. An input path signal 126 to the nonlinear amplifier 120 may be adjusted in accordance with the extracted error signal coefficient (e.g., phase and magnitude distortion) of the polar modulator 100 during real time operation, to effectively and continuously minimize distortion in the polar modulator 100 output. The adjusted modulated RF signal may be transmitted through antenna 128.

Figure 2:
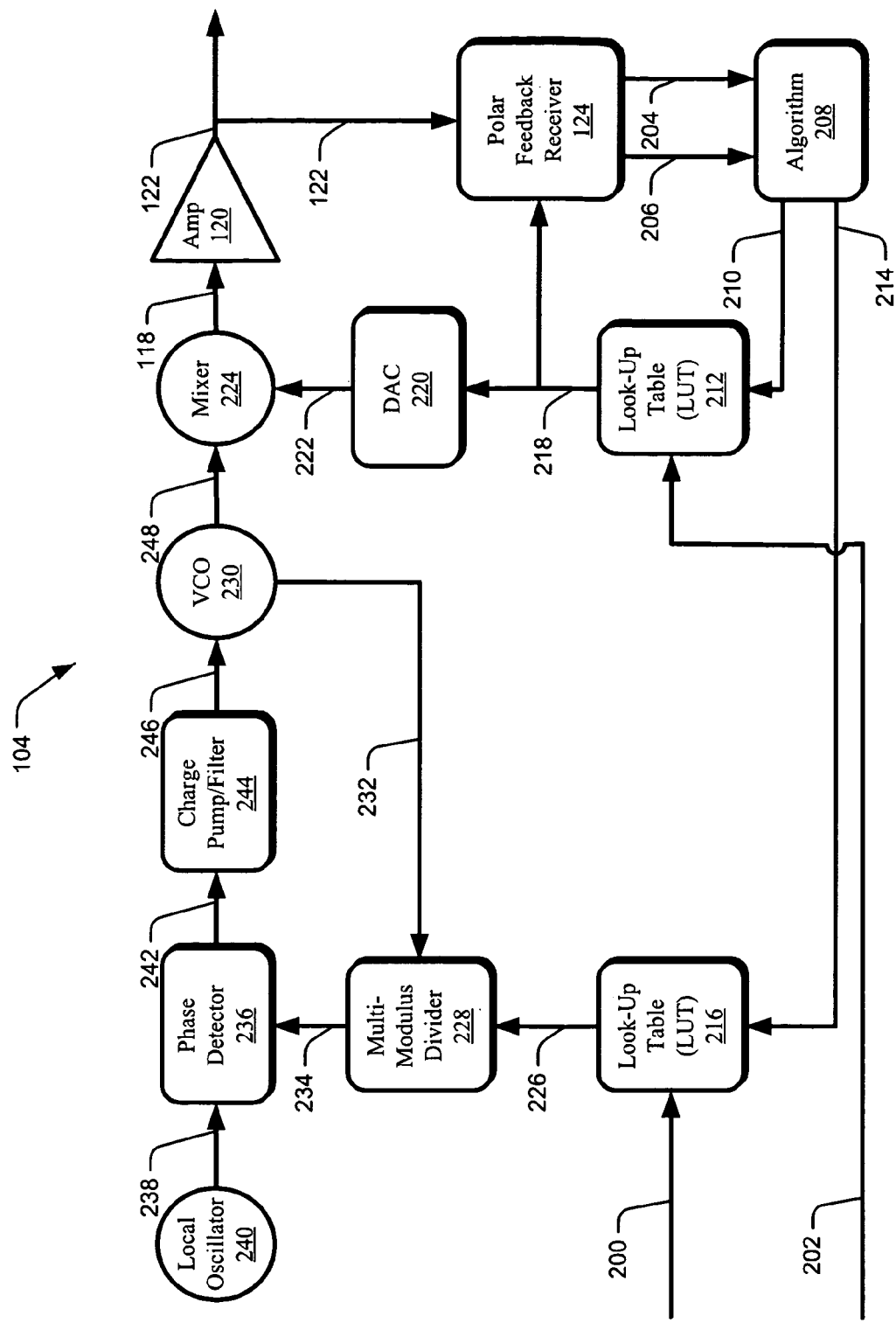
FIG. 2 is a block diagram of a Radio Frequency (RF) component for polar modulator.

FIG. 2 illustrates a RF component 104 using the polar feedback receiver 124 for linearization of the polar modulator 100. After transformation of the amplitudes of I and Q into polar form in DSP 112 of the baseband component 102, a baseband phase signal 200 and baseband magnitude signal 202 is received by RF component 104. The phase signal component of the baseband signal, may phase modulate the RF frequency carrier through the use of a local oscillator, phase detector, charge pump, filter, voltage controlled oscillator (VCO), and a multi modulus divider (MMD). The phase modulated RF signal may further undergo amplitude modulation by the baseband magnitude signal 202 to produce the varying envelope and phase modulation scheme.

The modulated RF signal 122 is coupled from the output of the polar modulator 100. The modulated RF signal (i.e., signal 122) may include the phase and magnitude of the baseband signal, together with the distortions, which may be demodulated by polar feedback receiver 124. The polar feedback receiver 124 may implement polar demodulation of the coupled modulated RF signal by directly extracting the phase and magnitude baseband signal together with the distortions. The polar feedback receiver 124 may extract the phase and magnitude baseband signal and the distortions to be used for measuring the error signal coefficient at the output of the polar modulator 100. The error signal coefficient may be used to compensate the phase and magnitude distortions to attain linear amplification and high power efficiency during transmission.

The output of polar feedback receiver 124 may include the phase signal information plus distortion signal 204 and the magnitude signal information plus distortion signal 206. Both signal 204 and signal 206 may enter algorithm component 208 which may be used to calculate error signal coefficient. The error signal coefficient may include the difference in gain between the phase and magnitude input sources, and the extracted phase and magnitude signal (including the distortions). The difference in gain may correspond to the calculated amount of distortion at the output of the polar modulator 100 which may be compensated to attain linear amplification and high power efficiency during transmission.

The output 210 of the algorithm component 208 may include the magnitude error signal coefficient, and is received by Look Up Table (LUT) 212 for magnitude compensation. The output or signal 214 from algorithm 208 may include the phase error signal coefficient, and is received by LUT 216 for phase compensation. Both LUT 212 and LUT 216 may include a data structure used to replace a runtime computation with a simpler lookup operation. The LUT 212 may contain magnitude gain factors, corresponding to the magnitude error signal coefficient in signal 210, which may be multiplied with the baseband magnitude signal 202 to produce the compensated magnitude signal. The LUT 216 may include phase gain factors, corresponding to the phase error signal coefficient in signal 214, which may be multiplied with the baseband phase signal 200 to produce the compensated phase signal.

A compensated magnitude signal 218 may be used for amplitude modulation in the polar modulator 100. The compensated magnitude signal 218 may further be used as an input signal into the polar feedback receiver 124 in order to produce a limited modulated RF signal. The limited modulated RF signal may include the modulated RF signal whose amplitude modulation content is removed. The amplitude modulation content may be removed through combination of the modulated RF signal with a low frequency inverse baseband magnitude signal to produce the limited modulated RF signal. The amplitude modulation content removal may contain a low frequency local oscillator signal that may be used to split the modulated RF signal into phase modulation and amplitude modulation components. The local oscillator signal is the frequency signal that is normally used to split the modulated RF signal into phase modulation and amplitude modulation components in a quadrature demodulator. However, delay sensitivity may occur due to different processing circuitry of the modulated RF signal and the local oscillator signal which may be included in the quadrature demodulator.

The low frequency inverse baseband magnitude may result from reversing the compensated magnitude signal 218 of the polar modulator 100. The combined output of the modulated RF signal and the low frequency inverse baseband magnitude may include a limited modulated RF signal whose phase signal can be directly extracted through the use of a phase discriminator. The phase discriminator is a component where the phase signal information is extracted for a given limited modulated RF signal. The limited modulated RF signal may further be used to extract the magnitude of the modulated RF signal together with the distortion due to nonlinearities in the polar modulator 100.

The compensated magnitude signal 218 is received by a digital to analog converter (DAC) 220 for amplitude modulation of the polar modulator 100. The DAC 220 may convert the compensated magnitude signal into analog compensated magnitude signal 222 received by mixer component 224. The analog compensated magnitude signal 222 may be used to amplitude modulate the phase modulated signal in mixer component 224. The mixer component 224 may combine the phase modulated RF signal with the analog compensated magnitude signal 222 in order to provide the varying envelope and phase modulation scheme for the polar modulator 100.

The compensated phase signal 226 may be used as a control signal for multi-modulus divider (MMD) 228. The MMD 228 may be used in the polar modulator 100 for low power, high operating frequencies, and high speed frequency synthesis applications to cover multiple frequency bands. The frequency synthesis applications may refer to a phase locked loop (PLL) based frequency synthesizer where the MMD 228 is placed between the output, and the feedback input includes the ability of the PLL to generate multiple frequencies at high speed applications. The MMD 228 may divide the output frequency of VCO 230, where the output frequency is received by MMD 228 as signal 232. The VCO 230 provides the up-converted frequency that is phase modulated by the baseband phase signal.

Signal 234 is the output of MMD 228 received by phase detector (PD) 236. The PD 236 provides a control signal which corresponds to the difference between the output of MMD 228 and signal 238. The signal 238 may include a reference frequency generated by local oscillator 240, which produces a constant reference frequency used for phase modulation in the polar modulator 100. The output or signal 242 of the PD 236 is received by charge pump/filter 244. The charge pump/filter 244 may include a positive output current and a negative output current activated by the control signal from PD 236. The positive output current or negative output current may be filtered by a low pass filter to produce a DC voltage or control voltage signal 246 to sustain operation of the VCO 230 at a desired frequency. Signal 248 may include the phase modulated output of VCO 230 entering into mixer component 224 for amplitude modulation. The output of mixer component 228 which may contain the varying envelope and phase modulated RF signal may pass through signal 118 for amplification in the nonlinear amplifier 120.

Figure 3:
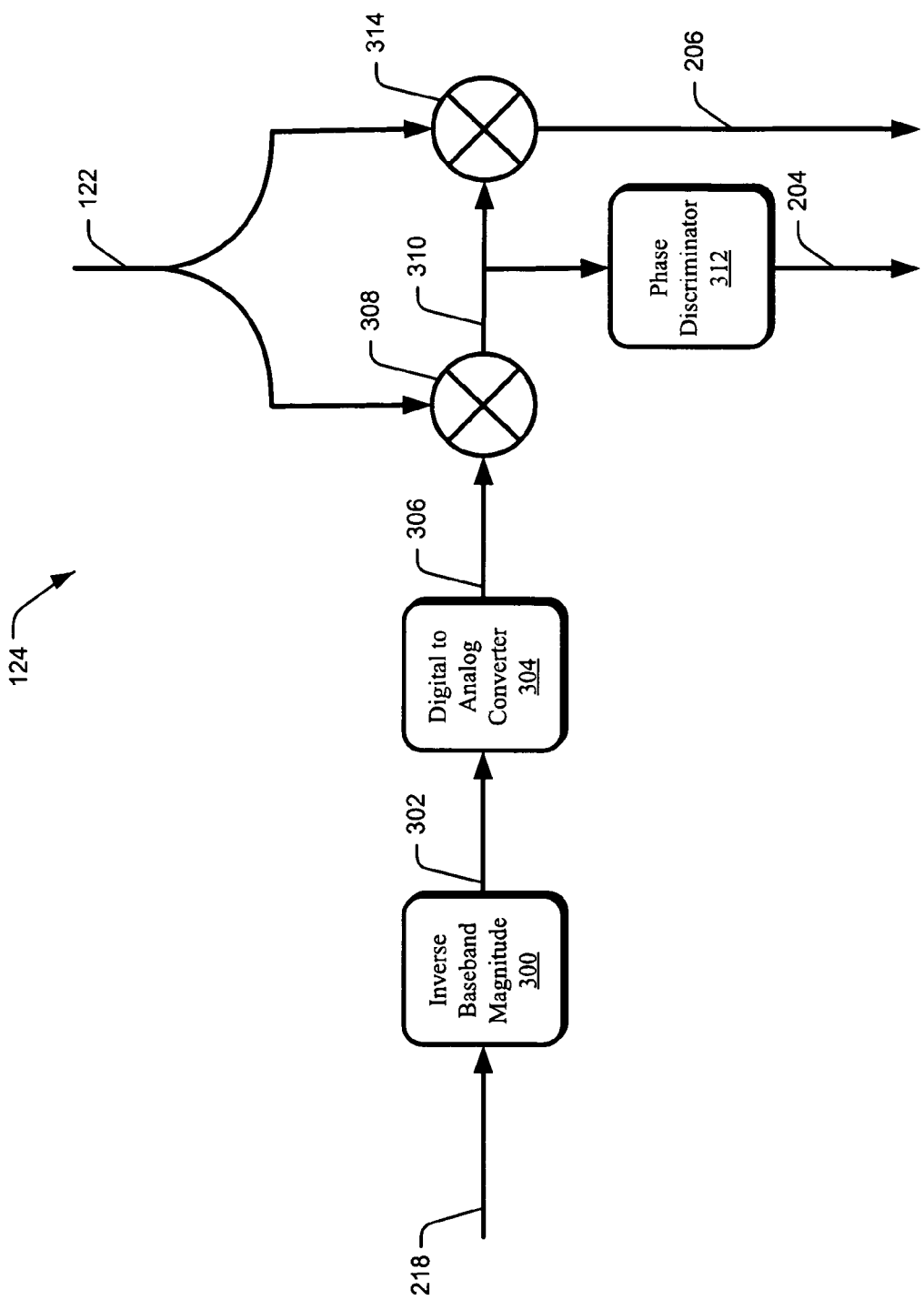
FIG. 3 is a block diagram of a polar feedback receiver.

FIG. 3 illustrates a polar feedback receiver 124 used for linearization of the polar modulator 100. A compensated magnitude signal 218 is received by an inverse baseband magnitude component 300. The inverse baseband magnitude component 300 may include a gain that reverses the compensated magnitude signal in signal 218. The reversed baseband magnitude signal 302 may include a low frequency inverse baseband magnitude signal used to directly extract the phase and magnitude signals in the modulated RF signal. Signal 302 may include low frequency inverse baseband magnitude received by DAC 304. The DAC 304 may convert the digital low frequency inverse baseband magnitude into analog low frequency inverse baseband magnitude to match the analog modulated RF output in signal 122.

The analog signal low frequency inverse baseband magnitude signal 306 is received by mixer component 308 for amplitude modulation content removal. The mixer component 308 may operate as a variable gain stage where one input signal may include the modulated RF signal 122, and the other signal may include the analog low frequency inverse baseband magnitude signal 306. The mixer component 308, operating as a variable gain stage, may strip away the amplitude modulation content without using additional circuitry like a local oscillator in quadrature demodulator. Removal of the amplitude modulation content in mixer component 308 may result in a limited modulated RF signal, and the phase information may be restored efficiently as compared to using a typical quadrature demodulator.

Limited modulated RF signal 310 may include a constant envelope phase modulated signal. The limited modulated RF signal 310 may be used to directly extract the phase component plus distortion of the modulated RF signal 122 through the use of a phase discriminator 312. The phase discriminator 312 may include amplitude variations in the output, which is a function of phase variation in the limited modulated RF signal 310. The limited modulated RF signal 310 may also be used to extract the magnitude of the modulated RF signal 122 through mixer component 312. The mixer component 312 may combine the magnitude of the modulated RF signal 122, and the limited modulated RF signal 310. The mixer component 312 may include an output that includes the magnitude of the baseband signal plus the distortion.

Figure 4:
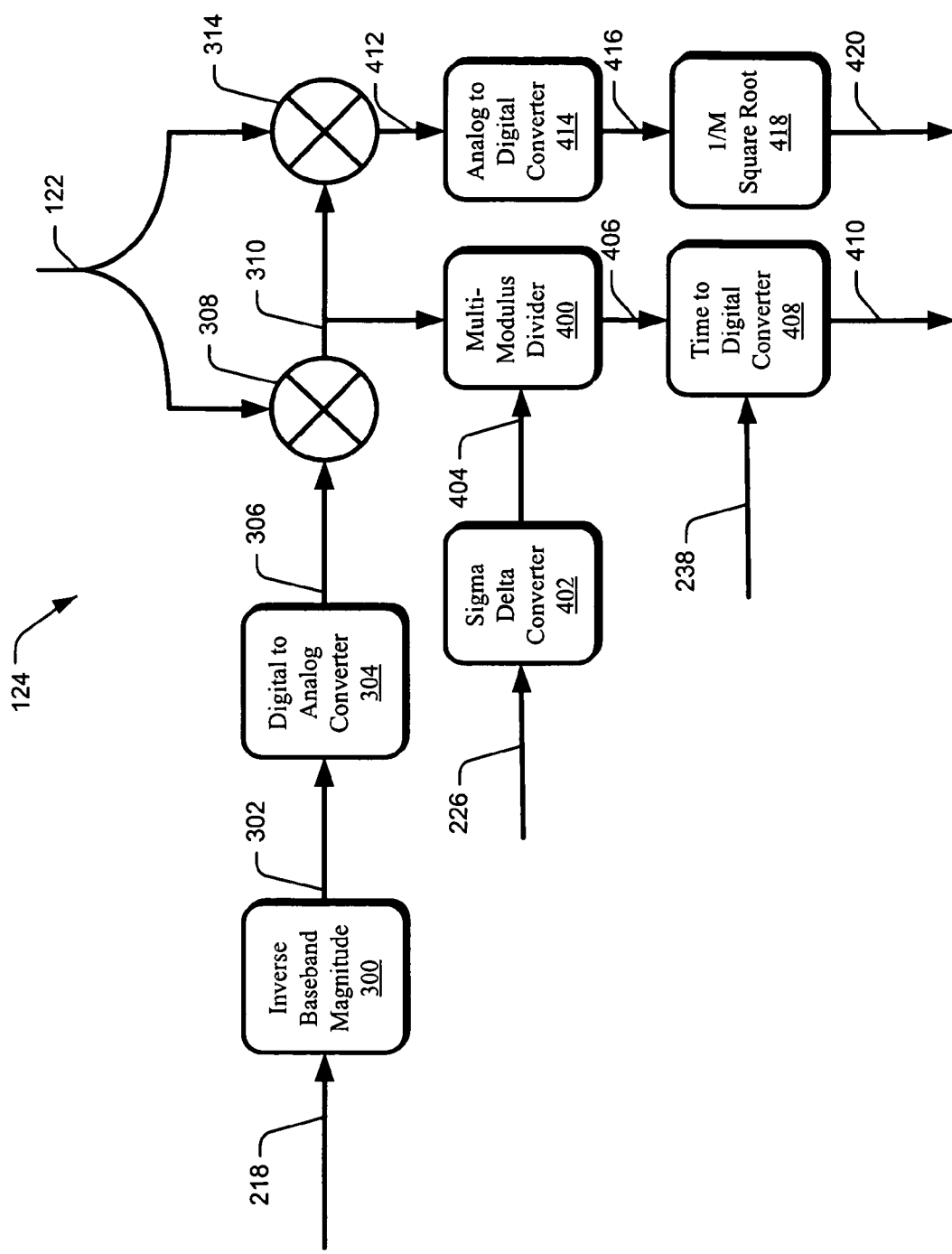
FIG. 4 is a block diagram illustrating a specific implementation of the polar feedback receiver in order to extract and measure the distortion only.

FIG. 4 illustrates an implementation of a polar feedback receiver 124, which includes direct extraction of distortions without the phase or magnitude component. To extract the phase distortion only in the polar modulator 100, the phase discriminator 312 may be implemented using a sigma delta converter, MMD component, and time to digital converter (TDC) component. An MMD 400 component divides the limited modulated RF signal 310, and removes the phase modulation, without the phase distortion, through the use of a sigma to delta converter 402. The sigma to delta converter 402 may include high precision conversion of the low frequency baseband phase signal 226 into an analog baseband phase signal 404. The output signal 406 of MMD 400 may include the analog phase distortion output and is received by TDC 408. The TDC 408 compares the signal edges of signal 406 to generate a delta time signal which can be converted to a delta time phase signal. The output signal 410 of TDC 408 may include only phase distortion.

In an implementation, the mixer component 314 may operate in linear mode (i.e., acts as a multiplier), and the signal 412 may include the magnitude of the modulated RF signal 122 and the square of the distortion. An analog to digital converter (ADC) 414 converts the extracted magnitude signal together with the square of the distortion, into a digital signal 416. The digital signal 416 is received by 1/M Square Root component 418. The 1/M Square Root component 418 divides the signal 416 by the baseband magnitude signal and calculates the square root of the distortion signal to produce signal 420 which may only include the amount of magnitude distortion.

Figure 5:
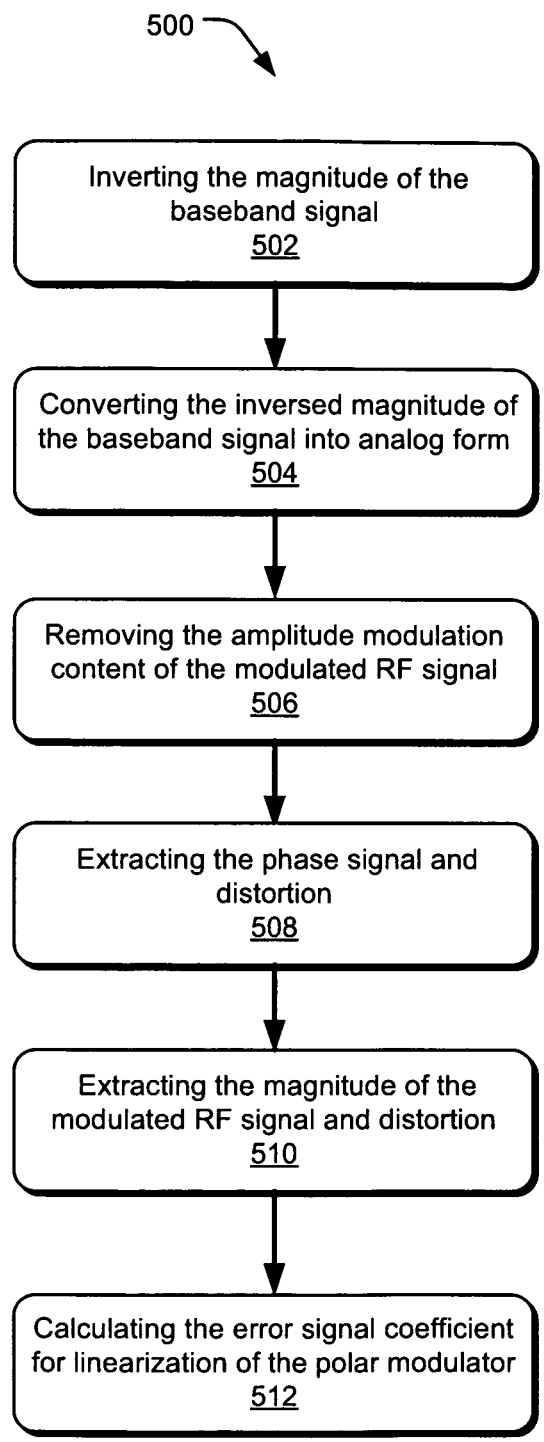
FIG. 5 is a flow chart illustrating a process for linearization of a polar modulator using polar feedback receiver.

FIG. 5 illustrates an exemplary method 500 for feedback receiver used for linearization in a modulator. In an implementation, the exemplary method 500 can be implemented in the polar modulator 100. The exemplary method 500 is described with reference to FIGS. 1-4. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 502, inverting a magnitude of a baseband signal is performed. For example, inverse baseband magnitude component 300 may include a gain that reverses the magnitude of the baseband signal to produce an inverse magnitude of the baseband signal in the polar modulator (e.g., polar modulator 100).

At block 504, converting the inverse magnitude of the baseband signal into analog form. In an implementation, a digital to analog converter component (e.g., DAC 304) may convert the inverse magnitude of the baseband signal into analog inverse magnitude of the baseband signal.

At block 506, removing an amplitude modulation content of a modulated RF signal is performed. A mixer (e.g., mixer component 308), operating as a variable gain stage, may combine the analog inverse magnitude of the baseband signal with the modulated RF signal to remove the amplitude modulation content of the modulated RF signal. In an implementation, the mixer (e.g., mixer component 308) contains an output that is referred to as a limited modulated RF signal.

At block 506, extracting a phase signal and distortion from the limited modulated RF signal is performed. A phase discriminator (e.g., phase discriminator 312) may directly extract the phase signal and distortion from the limited modulated RF signal.

At block 508, extracting a magnitude signal and distortion is performed. The limited modulated RF signal may be used as an input to a mixer (e.g., mixer component 314) which directly extracts the magnitude and distortion of the modulated RF signal by combining the modulated RF signal with the limited modulated RF signal.

At block 510, calculating an error signal coefficient for linearization of the polar modulator is performed. The algorithm (e.g., algorithm 208) may provide the error signal coefficient by calculating a difference between an input baseband signal sources (phase and magnitude) and the extracted signals (phase and magnitude signal with distortions) from the modulated RF signal.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. For example, the different circuits and components may be configured to perform linearization in a polar modulator.

What is claimed is:

1. A modulator comprising:
a radio frequency (RF) component to perform modulation of a baseband signal to produce a modulated RF signal utilizing a magnitude error coefficient and a phase error coefficient, the RF component comprising a feedback receiver to extract the baseband signal, for linear amplification, by producing a magnitude signal plus distortion and a phase signal plus distortion;
an algorithm component configured to generate the magnitude error coefficient according to the magnitude signal plus distortion and to generate the phase error coefficient according to the phase signal plus distortion, the magnitude error coefficient and the phase error coefficient collectively comprising an error signal coefficient;
wherein the RF component uses the feedback receiver for linear amplification by introducing an inverse magnitude baseband signal at the feedback receiver; and
wherein the RF component uses the feedback receiver to produce a limited modulated RF signal by combining the modulated RF signal with an inverse magnitude of the baseband signal, wherein the limited modulated RF signal is used to split the modulated RF signal into phase modulation and amplitude modulation components.

2. The modulator of claim wherein the RF component provides direct extraction of the baseband signal without conversion of domains.

3. The modulator of claim 1, wherein the RF component extracts the baseband signal for measuring the magnitude error coefficient and the phase error coefficient of the modulated RF signal.

4. The modulator of claim 3, wherein the error signal coefficient includes a delay between a phase modulation signal and an amplitude modulation signal, resulting in modulating signals being applied to different portions of a RF frequency carrier.

5. The modulator of claim 1, wherein the RF component comprises a high power efficiency nonlinear amplifier for amplification of the modulated RF signal.

6. The modulator of claim 1 further comprising a Look Up Table (LUT) component having magnitude gain factors corresponding to the magnitude error coefficient, wherein the linear amplification is generated from an output of the LUT which includes a compensated magnitude signal.

7. The modulator of claim 1, further comprising an inverse baseband magnitude component configured to generate a reversed baseband magnitude signal from a compensated magnitude signal and wherein the feedback receiver is configured to utilize the reversed baseband magnitude signal to remove amplitude modulation content from the modulated RF signal and produce a limited modulated RF signal.

8. The modulator of claim 7, wherein the feedback receiver is configured to extract the phase signal plus distortion from the limited modulated RF signal through the use of a phase discriminator.

9. The modulator of claim 8, wherein the feedback receiver is configured to combine the modulated RF signal and the limited modulated RF signal to generate the magnitude signal plus distortion.

10. The modulator of claim of claim 7, wherein the feedback receiver is configured to extract phase distortion from the limited modulated RF signal.

11. A modulator comprising:
a radio frequency (RF) component to perform modulation of a baseband signal to produce a modulated RF signal utilizing a magnitude error coefficient and a phase error coefficient, the RF component comprising a feedback receiver to extract the baseband signal, for linear amplification, by producing a magnitude signal plus distortion and a phase signal plus distortion;
an algorithm component configured to generate the magnitude error coefficient according to the magnitude signal plus distortion and to generate the phase error coefficient according to the phase signal plus distortion, the magnitude error coefficient and the phase error coefficient collectively comprising an error signal coefficient
an inverse baseband magnitude component configured to generate a reversed baseband magnitude signal from a compensated magnitude signal and wherein the feedback receiver is configured to utilize the reversed baseband magnitude signal to remove amplitude modulation content from the modulated RF signal and produce a limited modulated RF signal;

wherein the feedback receiver is configured to extract phase distortion from the limited modulated RF signal; and wherein the feedback receiver is configured to generate the magnitude signal plus distortion from the limited modulated RF signal and the modulated RF signal and to extract the magnitude distortion from the magnitude signal plus distortion using a square root component.

12. The modulator of claim 11, further comprising a lookup component configured to generate the compensated magnitude signal according to the magnitude error coefficient.

13. The modulator of claim 1, further comprising a baseband component configured to receive data signals, produce the baseband signal from the data signals, and provide the baseband signal to the radio frequency component.

* * * * *